United States Patent [19]

McClellan et al.

[11] Patent Number: 5,687,201
[45] Date of Patent: Nov. 11, 1997

[54] PHASE-LOCKED-LOOP WITH LINEAR COMBINATION OF CHARGE PUMP AND CURRENT CONTROLLED OSCILLATOR

[75] Inventors: Kelly Patrick McClellan, Irvine; Parameswaran K. Gopalier, Rancho Santa Margarita; Khosrow Haj Sadeghi, Irvine, all of Calif.

[73] Assignee: Standard Microsystems Corporation, Hauppauge, N.Y.

[21] Appl. No.: 719,310

[22] Filed: Sep. 24, 1996

Related U.S. Application Data

[63] Continuation of Ser. No. 407,895, Mar. 21, 1995, abandoned.

[51] Int. Cl.$^6$ .................................................. H03D 3/24
[52] U.S. Cl. ..................... 375/374; 375/376; 331/1 R; 331/25; 327/157
[58] Field of Search .............................. 375/374, 376; 331/1 R, 17, 18, 25, 1 A, 185, 186; 327/148, 156, 157, 158

[56] References Cited

U.S. PATENT DOCUMENTS

| | | | |
|---|---|---|---|
| 5,008,637 | 4/1991 | Ray | 331/17 |
| 5,144,156 | 9/1992 | Kawasaki | 331/17 |
| 5,334,953 | 8/1994 | Mijuskovic | 331/17 |
| 5,399,995 | 3/1995 | Kardontchik et al. | 375/376 |

*Primary Examiner*—Stephen Chin
*Assistant Examiner*—Don Vo
*Attorney, Agent, or Firm*—Meltzer, Lippe, Goldstein, Wolf & Schlissel, P.C.

[57] ABSTRACT

A phase-locked-loop (PLL) has a current controlled oscillator (ICO) whose gain varies with its input current. The PLL also contains a charge pump that controls the input current of the ICO and therefore the output frequency of the ICO. The charge pump has a gain that is controlled by the ICO input current in a manner which linearizes the combination of charge pump and ICO. This results in a substantially constant loop gain for a PLL.

12 Claims, 5 Drawing Sheets

PHASE-LOCKED-LOOP WITH LINEAR COMBINATION OF CHARGE PUMP AND CURRENT CONTROLLED OSCILLATOR

This is a continuation of U.S. patent application Ser. No. 08/407,895, entitled "PHASE-LOCKED-LOOP WITH LINEAR COMBINATION OF CHARGE PUMP AND CURRENT CONTROLLED OSCILLATOR", filed Mar. 21, 1995 for Kelly McClellan et al. now abandoned.

FIELD OF THE INVENTION

The present invention relates to a phase-locked-loop (PLL) having a substantially constant loop gain. More specifically, the present invention relates to a phase-locked-loop having a current controlled oscillator (ICO) that exhibits a gain that varies with its input current. The PLL also contains a charge pump that controls the input current of the ICO and therefore the output frequency of the ICO. The charge pump has a gain that is controlled by the ICO input current in a manner which linearizes the combination of charge pump and ICO. This results in a substantially constant loop gain for the PLL.

BACKGROUND OF THE INVENTION

PLL's are used widely in applications requiring controlled loop gains to ensure optimum time response. In an integrated circuit implementation of a PLL, the loop gain of the PLL may vary with temperature, supply voltage, and process dependent parameters such as oxide thickness.

A known phase-locked loop (PLL) system 100 is illustrated in FIG. 1. The PLL system 100 includes a phase comparator (detector) 10 which receives a self-clocking DATA signal from an asynchronous data source such as a local area network. The comparator 10 supplies a frequency incrementing control signal FUP and a frequency decrementing control signal FDN to a charge pump 20. The charge pump 20 generates a pump output current $I_p$ which flows in either a positive or negative direction depending on whether one or the other of the respective frequency incrementing/decrementing signals, FUP or FDN, is supplied. The pump output current $I_p$ is generated as one or more fixed magnitude pulses 21, each having a pulse width $P_w$ equal to the time either the FUP or FDN signal is applied. The $I_p$ current pulses will either add charge into or withdraw charge out from a charge accumulating capacitor 30. The capacitor 30 has a predetermined capacitance $C_i$. Charge accumulation in the capacitor 30 generates an integrated voltage $V_i = \Sigma I_p P_w / C_i$ which is applied to the input of a voltage controlled oscillator (VCO) 40. The VCO 40 produces a periodic CLOCK signal having a variable frequency $F_{out}$ which is a function of the input voltage $V_i$. The CLOCK signal is fed back to one input of the phase comparator 10 while the DATA signal, which is generally aperiodic and is therefore of unknown phase and frequency, is supplied to another input of the phase comparator 10.

Although the DATA signal is generally aperiodic, it is self-clocking in the sense that it has a fundamental clocking frequency which can be derived by averaging over time. The PLL system 100 is designed to derive this fundamental clocking frequency and to lock on to the phase of the incoming DATA signal as well. The operation of the PLL system will be explained for the case where the CLOCK signal lags behind the DATA signal and then for the case where the CLOCK signal leads the DATA signal.

In situations where incoming edges of the DATA signal arrive before the corresponding edges of the CLOCK signal (the CLOCK signal lags), the phase comparator 10 outputs the frequency incrementing signal FUP to the charge pump 20 and thereby causes the charge pump to inject the pump current $I_p$ into the integrating capacitor 30 so as to accumulate charge therein. The input voltage $V_i$ of the VCO 40 is incremented by the accumulated charge and, in response, the VCO increases the speed of the CLOCK signal. The CLOCK frequency $F_{out}$ is incremented to a value greater than the fundamental clocking frequency of the DATA signal. The edges of the faster CLOCK signal then begin to catch up with the edges of the slower DATA signal. The output frequency $F_{out}$ drops back to the value of the fundamental clocking frequency as the CLOCK edges close in on the DATA signal edges. Once the CLOCK signal is substantially in phase with the DATA signal, the phase comparator 10 ceases to output the frequency incrementing signal FUP and the output frequency $F_{out}$ is held at a steady state value which is for practical purposes equal to the fundamental clocking frequency of the DATA signal.

For cases where the DATA signal edges lag behind the CLOCK signal edges, the phase comparator 10 outputs the frequency decrementing signal FDN to the charge pump 20 thereby causing the charge pump to drain pump current $I_p$ from capacitor 30, causing it to discharge, thereby reducing $V_i$ and causing the output $F_{out}$ of the VCO to slow down. This delays the CLOCK signal edges until the edges of the DATA signal catch up to and align with the CLOCK signal. The FDN control signal is shut off once phase alignment is obtained.

The speed at which the PLL system 100 comes into alignment with the incoming DATA signal is referred to as the slew rate. The slew rate is determined by a characteristic loop gain $G_{LOOP}$ of the PLL system, which in turn is set by the gain functions (transfer functions) of the charge pump 20 and the VCO 40. For most applications, the loop gain $G_{LOOP}$ of the PLL system 100 is kept constant to prevent undesirable loop oscillations. Circuit designers often purposefully provide the charge pump 20 with a constant gain, that is, they hold the magnitude of the pump current $I_p$ at a constant level. Typically, the charge pump 20 is designed to deliver the pump current $I_p$ in the form of positive or negative rectangular current pulses 21. The magnitude of the VCO input voltage $V_i$ is changed by modulating the pulse width $P_w$ of the pump current pulses 21.

The gain function of the VCO 40 describes the relationship between the output frequency $F_{out}$ of the VCO 40 and the input voltage $V_i$. The gain function of the VCO 40 is typically non-linear.

The system loop gain $G_{LOOP}$ is in part a function of how quickly the output frequency $F_{out}$ changes relative to a variable phase difference $\Delta t$ (see FIG. 1) detected by the phase detector (comparator) 10. The phase difference $\Delta t$ is the timing gap between corresponding edges of the CLOCK and DATA signals. Since the voltage $V_i$ across the capacitor 30 rises linearly relative to the phase difference $\Delta t$ ($V_i = I_p \Delta t / C_i$ where $\Delta t$ is the time of application of the pump current $I_p$), only the slope of the VCO gain function is of concern. The loop gain of the PLL system 100 is therefore often defined as:

$$G_{LOOP} = f(dF_{out}/dV_i)$$

The above definition reflects the concern of PLL system designers for the non-linearity of the VCO's gain function. Generally it is desirable to force the VCO gain function to be as linear as possible. This can be done by modifying the design of the VCO to include, for example a pre-compensation circuit (not shown) between the capacitor 30 and VCO 40. The pre-compensation circuit changes the input voltage $V_i$ so as to compensate for the non-linearity of the VCO gain function.

U.S. Pat. No. 5,126,692, the contents of which are incorporated herein by reference, takes a different approach. This reference discloses a PLL with a variable gain charge pump whose gain is set by the VCO input voltage $V_i$. A PLL with this configuration is shown in FIG. 2. The PLL 200 of FIG. 2 differs from the PLL 100 of FIG. 1 in that the PLL 200 of FIG. 2 includes a variable gain charge pump 50 which has a variable gain input 50a, that is responsive to a gain control voltage $V_g$. A voltage linking or coupling element 60 is provided between an input voltage $V_{i2}$ of VCO 40 and the gain control input 50a of the charge pump 50 so that the control voltage $V_g$ will be a function of $V_{i2}$. In the case where the coupling element 60 is simply a wire $V_{i2}=V_g$.

In the PLL 200 of FIG. 2, the variable gain charge pump 50 feeds a charge accumulating element (e.g. capacitor) 30 which in turn supplies the frequency modulating voltage $V_{i2}$ to the VCO 40. The characteristic gain function of the variable gain charge pump is arranged to counter balance the characteristic gain function of the VCO to produce a constant loop gain. (This means, for example, that the product of the slope of the VCO gain function and the amplitude of the charge pump gain function is constant over a predetermined range of VCO input voltages and output frequencies.) A generally linear combined transfer function results from the counterbalancing effect of the characteristic gain functions belonging to the VCO and the charge pump.

However, the above-described technique is not the optimum technique for reducing loop gain variations in a PLL wherein the VCO comprises a voltage-to-current converter and an ICO.

In view of the foregoing, it is an object of the present invention to replace the above-described voltage feedback technique for reducing the gain variation in a PLL with a current feedback technique which is less complex, more accurate, and suitable for use with a PLL containing an ICO.

Another technique for controlling the gain of a PLL is disclosed in U.S. patent application Ser. No. 08/088,008 entitled "Improved Analog PLL Clock Recovery Circuit and LAN Transceiver Employing The Same" filed for Kelly McClellan, Benjamin Nise, and Nariman Yousefi on Jul. 6, 1993 and assigned to the assignee hereof. The contents of this patent application are incorporated herein by reference. In this reference, the gain of the PLL is controlled by selecting the magnitude of the current pulses produced by the charge pump from a set of available discrete magnitudes depending on the DATA, CLOCK and FDN signals. A shortcoming of this approach, however, is that the magnitude of the charge pump current output pulses do not vary continuously. Thus, continuous variations in the gain function of a VCO or ICO cannot be offset by continuous variations in the gain function of the charge pump (as the gain function of the charge pump changes only discretely).

It is also an object of the present invention to provide a PLL having a charge pump whose output current pulses vary continuously in magnitude to offset gain variations in an ICO.

It is a further object of the present invention to provide a PLL in which variations in loop gain resulting from process dependent parameter variations (e.g. oxide thickness) or from other parameter variation (e.g. temperature or supply voltage) are reduced.

SUMMARY OF THE INVENTION

In accordance with an illustrative embodiment of the present invention, a PLL comprises a phase comparator which compares a self-clocking DATA signal from an asynchronous data source and a CLOCK signal. Depending on the results of the comparison, the CLOCK frequency incrementing signal FUP or the CLOCK frequency decrementing signal FDN is outputted to a variable gain charge pump. The charge pump outputs current pulses which flow in either a positive or negative direction to add charge to or remove charge from a charge accumulating device (e.g. a capacitor) depending on whether FUP or FDN is supplied by the comparator. The duration of the positive charge pump output current pulses is determined by FUP. The duration of the negative charge pump output current pulses is determined by FDN. The magnitude $I_p$ of the current pulses is variable and is determined in a manner to be discussed below.

The inventive phase-locked-loop also comprises a voltage-to-current converter and a current controlled oscillator (ICO). The voltage-to-current converter converts a voltage outputted by the charge accumulating device and representing the accumulated current pulses into a control input current $I_{ICO}$ for the ICO. The output of the ICO is the CLOCK signal with frequency $F_{out}$. $F_{out}$ increases or decreases depending on the control input current which in turn depends upon whether positive or negative current pulses are generated by the charge pump.

In the PLL that is the subject of the present invention, the gain of the ICO is inversely proportional to its control current $I_{ICO}$. In accordance with the invention, the ICO control current $I_{ICO}$ is used to control the gain of the charge pump as well via a feedback circuit. The feedback circuit insures that when the ICO gain increases (decreases) the charge pump gain decreases (increases), thus, keeping the overall loop gain of the PLL substantially constant. In other words, the current $I_{ICO}$ controls, via the feedback circuit, the magnitude of the current pulses output by the charge pump to maintain a constant loop gain.

It is a significant advantage of the invention that the magnitude of the charge pump current pulses varies continuously in response to changes in $I_{ICO}$.

It is also a significant advantage of the invention that the PLL response is relatively constant with respect to changes in various parameters such as temperature, supply voltage, and I.C. processing parameters as a result of the inventive feedback control technique.

DETAILED DESCRIPTION OF THE INVENTION

Figure 1:
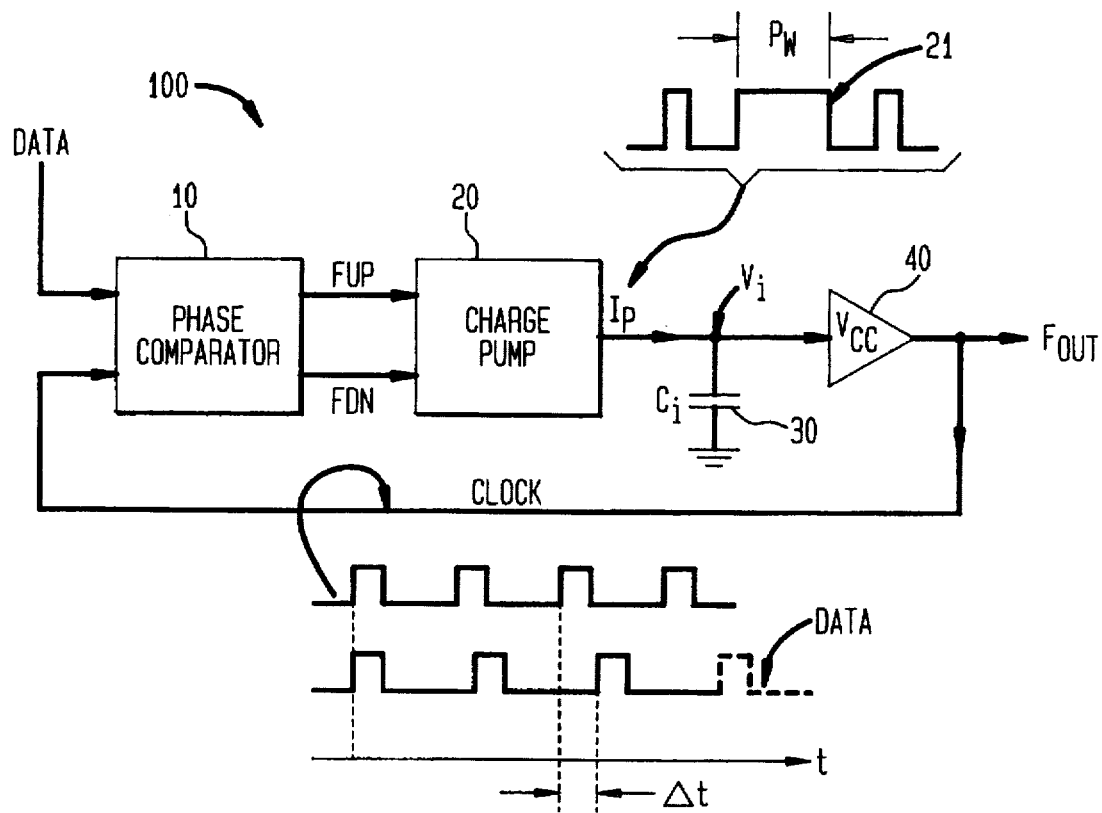
FIG. 1 schematically illustrates a first prior art phase-locked-loop.
Figure 2:
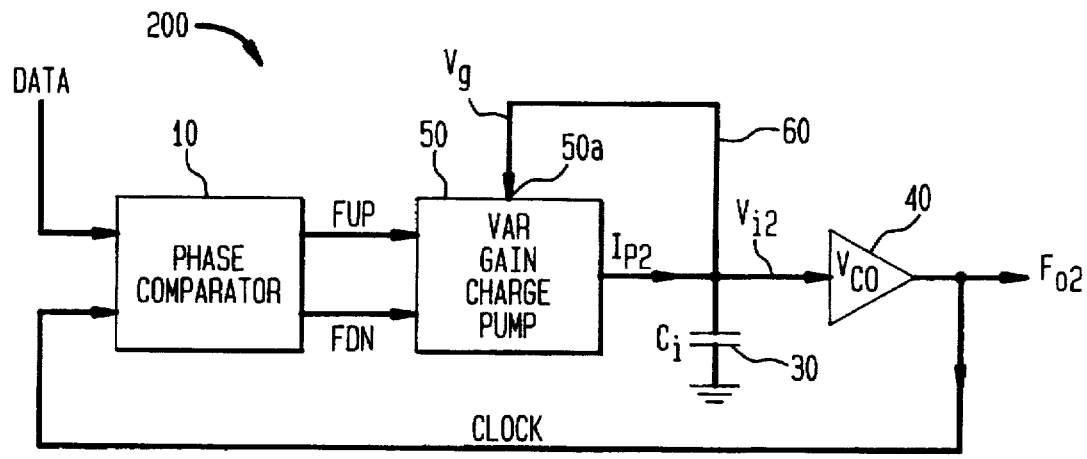
FIG. 2 schematically illustrates a second prior art phase-locked-loop.
Figure 3:
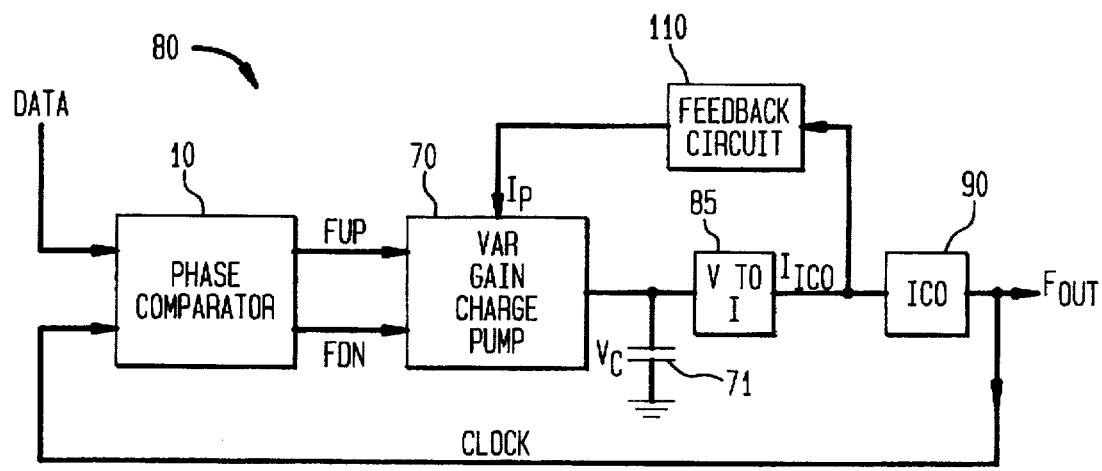
FIG. 3 illustrates a phase-locked-loop in accordance with an illustrative embodiment of the present invention.

A phase-locked-loop 80 in accordance with the present invention is shown in FIG. 3. The phase-locked-loop 80 comprises a phase comparator 10 which receives as inputs a self-clocking DATA signal from an asynchronous data source and a CLOCK signal which is generated by the ICO 90. The CLOCK signal has a variable frequency $F_{out}$. In a manner described in detail above, depending on whether the CLOCK signal lags behind or is ahead of the DATA signal, the signals FUP and FDN are generated. The phase comparator 10 is described in greater detail in connection with FIG. 4.

The signals FUP and FDN are outputted by the phase comparator 10 to a variable gain charge pump 70. The output of the variable gain charge pump 70 are current pulses of magnitude $I_p$ which flow in either a positive or negative direction to add charge to or remove charge from the capacitor (or other charge accumulating element) 71. The duration of the positive current pulses is equal to that of the corresponding pulses of FUP. The duration of the negative current pulses is equal to that of the corresponding pulses of FDN. The magnitude $I_p$ of the current pulses varies continuously from a minimum to a maximum. The manner in which the magnitude of the charge pump current $I_p$ is determined is explained in detail below. The operation of the variable gain charge pump 70 is described below in greater detail in connection with FIG. 5.

The voltage to current converter 85 converts the voltage $V_c$ of the capacitor 71 into a control input current $I_{ICO}$ of the ICO 90. The control current $I_{ICO}$ determines the frequency $F_{out}$ of the CLOCK signal.

The gain of the ICO 90 is inversely proportional to the control current $I_{ICO}$. The detailed operation of the voltage-to-current converter 85 and ICO 90 is explained below in connection with FIG. 6.

The current $I_{ICO}$ controls the gain of the charge pump 70 via the feedback circuit 110. More particularly, the feedback circuit 110 causes the charge pump current magnitude $I_p$ to vary proportionally with changes in $I_{ICO}$ to maintain a constant loop gain. The feedback circuit 110 is shown in greater detail below in FIG. 7.

Figure 4:
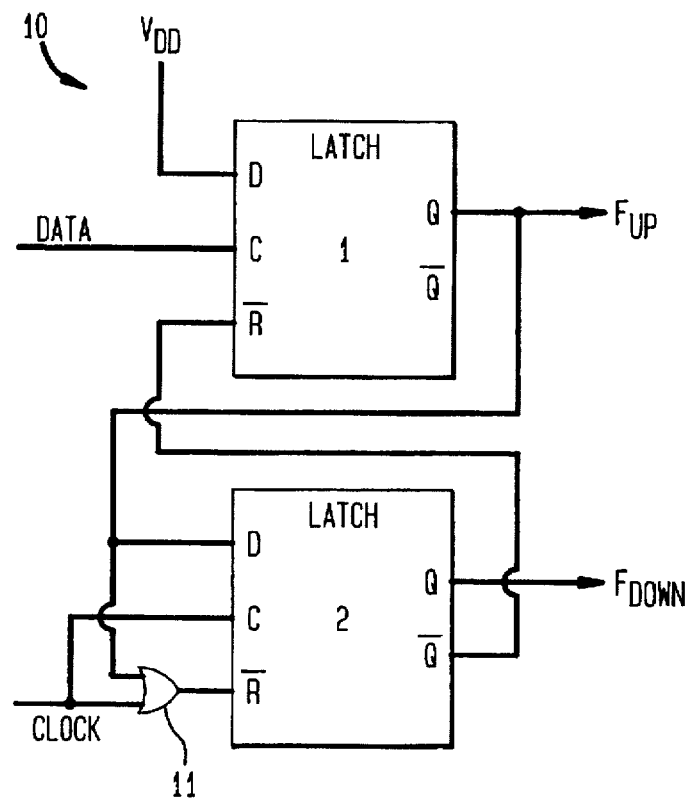
FIG. 4 illustrates a phase comparator for use in the PLL of FIG. 3.

The phase comparator 10 of FIG. 3 is shown in greater detail in FIG. 4. The phase comparator 10 comprises D-latch 1 and D-latch 2. The D-latch 1 outputs the FUP signal at its Q output. The inputs to the D-latch 1 are the DATA signal at the C terminal and the supply voltage VDD at the D terminal. The $\overline{Q}$ output of the D-latch 2 is connected to the R (Reset) terminal of the D-latch 1. The D-latch 2 outputs the FDN signal at its Q output. The Q output terminal of the D-latch 1 is connected to the D input terminal of the D-latch 2 and to one input of OR-gate 11. The other input of the OR-gate 11 receives the CLOCK signal as does the C input of the D-latch 2.

Figure 5A:
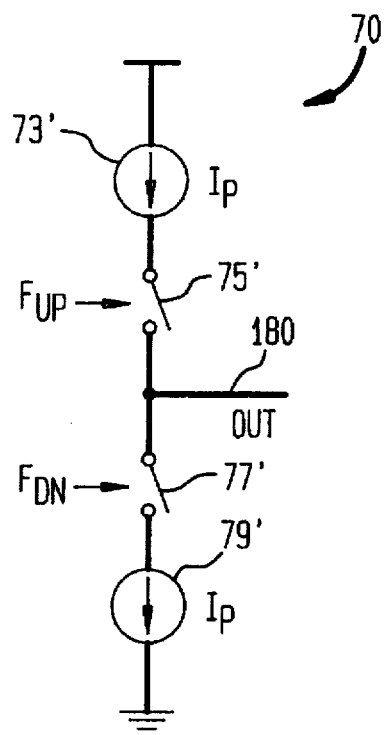
FIGS. 5A and 5B illustrate a charge pump for use in the PLL of FIG. 3.

An equivalent circuit which illustrates the operation of the charge pump 70 is shown in FIG. 5A. The charge pump 70 as shown in FIG. 5A comprises a positive current source 73' of magnitude $I_p$ and a negative current source 79' of magnitude $I_p$. The magnitude of $I_p$ is variable and is determined by the feedback circuit 110 in a manner described below. A first switch 75' is controlled by the FUP signal. A second switch 77' is controlled by the FDN signal.

Positive current pulses of magnitude $I_p$ are generated on output line 180 in response to the signal FUP and negative current pulses of magnitude $I_p$ are generated on line 180 in response to the signal FDN.

Figure 5B:
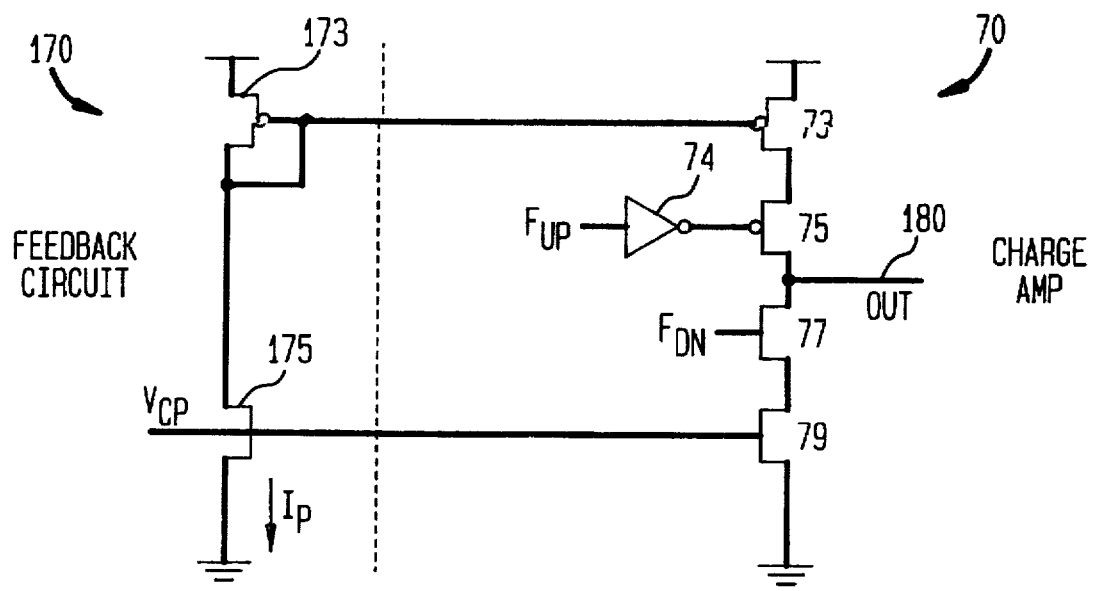

The charge pump 70 is shown in greater detail in FIG. 5B. The charge pump 70 is a slave current leg whose current $I_p$ is controlled by the master current leg 170 of the feedback circuit 110. More specifically, the charge pump 70 comprises the P-channel FET 73 whose gate is connected to the gate and the drain of the P-channel FET 173 of the leg 170. The charge pump 70 also comprises a second P-channel FET 75 whose gate voltage is determined by FUP via the inverter 74. The N-channel FET 77 has a gate voltage determined by FDN. The N-channel FET 79 has a gate voltage $V_{CP}$ which is the same gate voltage of the N-channel FET 175 of the leg 170 of the feedback circuit 110 and which is determined by the feedback circuit 110 in a manner described in detail below. As indicated above, the output of the charge pump 70 having a level such as in the form of positive or negative current pulse of variable magnitude $I_p$ is obtained on line 180.

Figure 6:
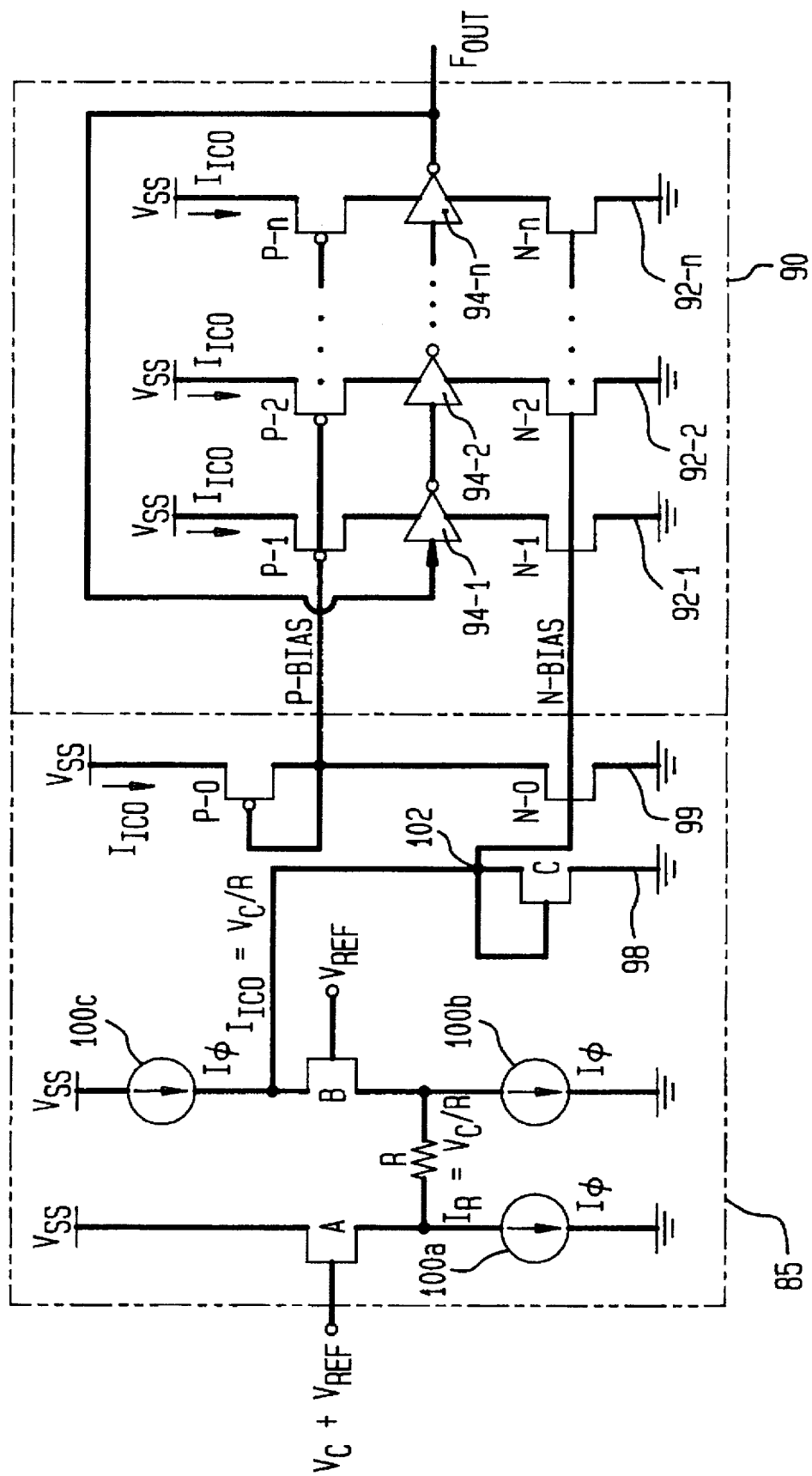
FIG. 6 illustrates a voltage-to-current converter and an ICO for use in the PLL of FIG. 3.

The voltage-to-current converter 85 and current controlled oscillator (ICO) 90 are shown in greater detail in FIG. 6.

The ICO 90 comprises a plurality of current legs 92-1, 92-2, ..., 92-n which are arranged to form a ring oscillator. Each leg 92-1, 92-2, ..., 92-n comprises a pair of FETs N1, P1; N2, P2; ...; Nn, Pn. (A "P" indicates a P-channel FET and "N" indicates an N-channel FET). Each leg 92-1, 92-2, ..., 92-n also contains an inverter 94-1, 94-2, ..., 94-n. The FETs N1, P1; N2, P2; etc. supply a biasing current $I_{ICO}$ to the inverters 94-1, 94-2, etc. The biasing current $I_{ICO}$ is determined by the voltage-to-current converter 85 which serves as a biasing source. To form the ring oscillator, the output of the last inverter 94-n is connected back to the input of the first inverter 94-1. The ICO output signal with frequency $F_{out}$ is obtained at the output of the last inverter 94-n. The frequency $F_{out}$ is determined by the signal propagation times of the inverters 94-1, 94-2, ..., 94-n. These delays are in turn determined by the bias current $I_{ICO}$ flowing in each leg 92. Thus, by varying the bias current $I_{ICO}$, the frequency $F_{out}$ is controlled.

The current $I_{ICO}$ is determined by the voltage $V_c$ applied to the voltage-to-current converter 85. The biasing source 85, which serves as a voltage-to-current converter, determines $I_{ICO}$ in response to $V_c$. The biasing source 85 comprises a pair of NFETs A and B which act as source followers with essentially equal $V_{gs}$. $V_c$ and a reference voltage $V_{REF}$ are applied to the gate of NFET A; the reference voltage $V_{REF}$ is also applied to the gate of NFET B. $V_c$ appears across resistor R, so that $I_R = V_c/R$ flows through R. The current sources 100a, 100b, 100c all have a current value $I_\phi$. $I_\phi > I_R$ so that $I_{ICO} = I_\phi - (I_\phi - I_R)$. The current $I_{ICO}$ is obtained in the leg 98.

$I_{ICO}$ is converted into a voltage by a third NFET C in leg 98. This voltage is determined by the current $I_{ICO}$ at point 102. This voltage is supplied to the gate of NFET N-0 and to the gate and drain of PFET P-0. These FETs supply the N and P FET biases for the FET ring oscillator. Another way to look at this is that the leg 99, and legs 92-1, ..., 92-n are current mirrors of the leg 98 which carries current $I_{ICO}$.

When the voltage $V_c$ at the gate of NFET A increases, more current will flow through the V leg 98, and, as a result of current mirroring, the current in each of the legs 92 will also increase (in other words $I_{ICO}$ increases). As a result, $F_{out}$ will increase. Conversely, when $V_c$ decreases, the current flowing in the leg 98 decreases as does the current in all of the legs 92 (in other words, $I_{ICO}$ decreases).

The variable current $I_{ICO}$ is also used to generate the variable charge pump current $I_p$. The charge pump current $I_p$ is derived from $I_{ICO}$ using the feedback circuit 110.

Figure 7:
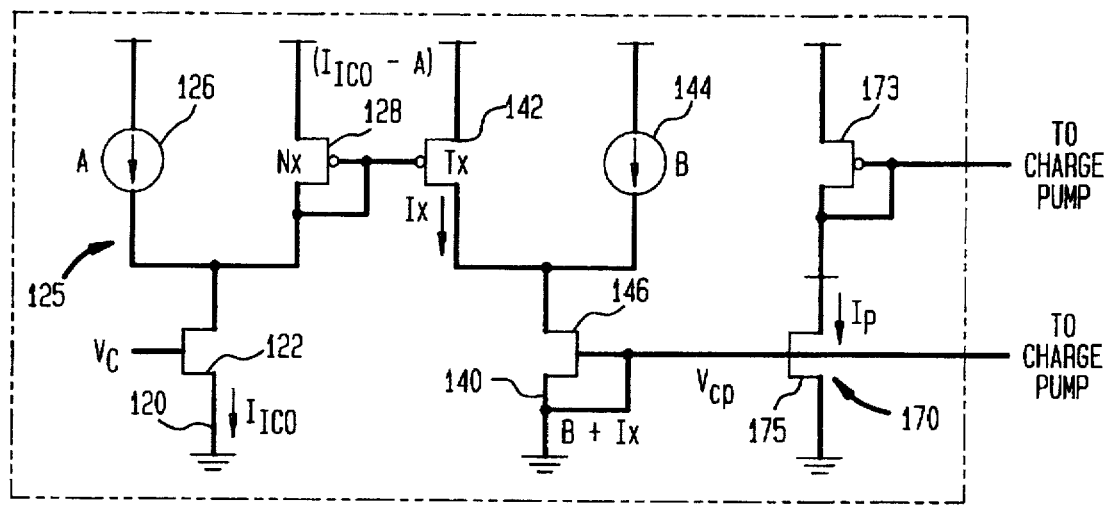
FIG. 7 illustrates a feedback circuit for use in the PLL of FIG. 3.

The feedback circuit 110 is shown in greater detail in FIG. 7. The feedback circuit 110 comprises three current legs 120, 140, and 170. The leg 120 is a current mirror with leg 98 (see FIG. 6). The leg 120 includes the FET 122 and the current divider 125 which comprises the fixed current source 126 for generating the current A and the Nx sized FET 128. The current A is set to a value less than the largest expected $I_{ICO}$. The total current in the leg 120 is $I_{ICO}$ (because of the current mirror relationship with leg 98 of FIG. 6). The current in the FET 128 is $I_{ICO} - A$.

The current leg 140 comprises a 1× sized P-channel FET 142, a current source 144 of value B and an N-channel FET 146. The current B is set to the minimum desired value for Ip. The current $I_x$ in the FET 142 is $(I_{ICO}-A)/N$. The total current in the leg 140 is $B+I_x$.

The leg 170, comprising the FETs 173 and 175, forms a current mirror with the leg 140. The gate of the FET 146 is connected to the gate of the FET 175 to form this current mirror and the voltage applied to these gates is denoted $V_{CP}$. The current in the leg 170 is the charge pump current $I_p$. (As noted above, the charge pump leg 70 as shown in FIG. 5B is in a master-slave relationship with the leg 170).

Note that because of current mirroring between the legs 140 and 170, the charge pump current $I_p$ varies directly with the current $I_x$. The current $I_x$, in turn, varies proportionally with $I_{ICO}$. Thus, as $I_{ICO}$ increases, $I_p$ increases and vicaversa.

Figure 8:
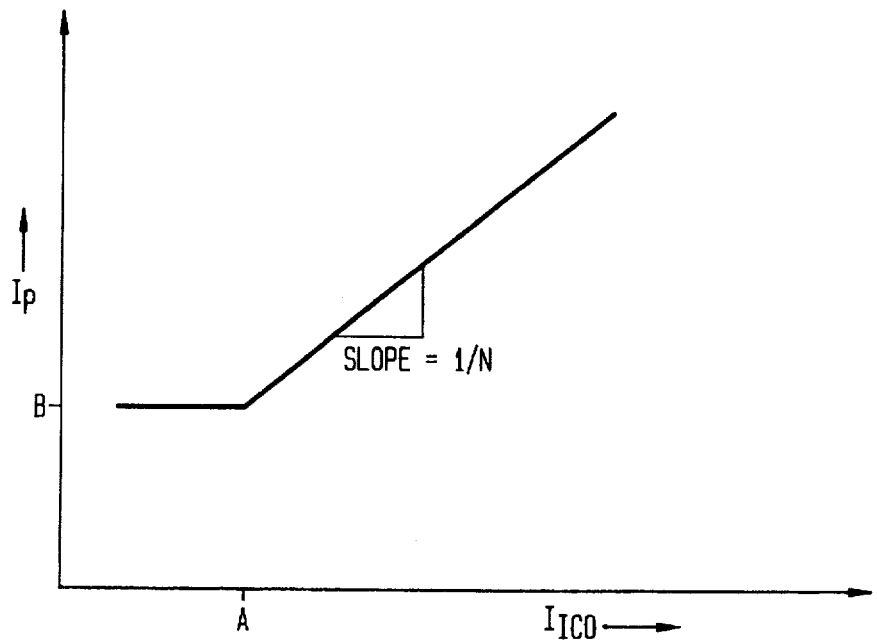
FIG. 8 is a plot of $I_p$ versus $I_{ICO}$ in accordance with the invention.

FIG. 8 is a plot of $I_p$ versus $I_{ICO}$, and, thus a plot of the transfer function of the feedback circuit 110.

In short, a phase-locked-loop with a linear combination of charge pump and $I_{ICO}$ has been disclosed.

Finally, the above-described embodiments of the invention are intended to be illustrative only. Numerous alternative embodiments may be devised by those skilled in the art without departing from the spirit and scope of the following claims.

We claim:

1. A phase-locked-loop comprising:

a phase comparator for receiving first and second periodic signals, and for providing a frequency up signal if the second signal lags the first signal and a frequency down signal if the second signal leads the first signal;

a charge pump for generating positive current levels in response to the frequency up signal and negative current levels in response to the frequency down signal, the magnitude of the positive and negative current levels being variable and being dependent on a charge pump current;

an accumulator for accumulating charges of said positive and negative current levels and for generating a voltage in response to the accumulated charge;

a voltage-to-current converter for converting said voltage of said accumulator into a control current; and a current controlled oscillator for generating said second signal in response to said control current, the frequency of said second signal being dependent on said control current;

said charge pump current also being dependent on said control current, wherein said charge pump current has a minimum value B, said value B insures that said charge pump current has a non-zero value, and said control current has to be above a threshold A to cause an increase in said charge pump current.

2. The phase-locked-loop of claim 1, wherein;

said charge pump has a gain which varies continuously in response to changes in the control current.

3. The phase-locked loop of claim 1 further including a feedback circuit which has said control current as an input and said charge pump current as an output.

4. A phase-locked-loop, comprising:

a charge pump having a continuously variable charge pump current and for generating positive and negative output current levels whose magnitude depend on the magnitude of the charge pump current;

a current controlled oscillator having an input current determined by the output current levels generated by the charge pump; and a feedback circuit for generating said charge pump current in response to said input current of said current controlled oscillator such that said charge pump current varies proportionally with to said input current, wherein said feedback circuit insures that said charge pump current has a minimum value B, and wherein said value B insures that said charge pump current has a non-zero value, and wherein said feedback circuit insures that said input current is above a threshold A to cause an increase in said charge pump current.

5. The phase-locked-loop of claim 4, further comprising:

a phase comparator for receiving first and second periodic signals and for providing a frequency up signal if said second signal lags said first signal and a frequency down signal if said second signal leads said first signal.

6. The phase-locked-loop of claim 5, wherein said charge pump generates positive current output levels in response to said frequency up signal and negative current output levels in response to said frequency down signal.

7. The phase-locked-loop of claim 6, further comprising an accumulator for accumulating charges of said positive and negative current levels and for generating a voltage in response to the accumulated charge.

8. The phase-locked-loop of claim 7 further including a voltage-to-current converter for generating said input current of said current controlled oscillator in response to said voltage of said accumulator.

9. The phase-locked-loop of claim 4 wherein said first signal is a data signal from an asynchronous data source and said second signal is an output signal of said current controlled oscillator.

10. A phase-locked-loop, comprising:

a phase comparator for receiving first and second periodic signals and providing a phase difference signal corresponding to the amount by which the first signal leads or lags the second signal;

a charge pump responsive to the phase difference signal for generating positive and negative current pulses;

an accumulator for accumulating the charge of the positive and negative current pulses and for generating a voltage indicative of the accumulated charge;

a voltage-to-current converter for converting said voltage into a control current;

a current controlled oscillator which generates said second signal at a frequency determined by said control current; and a feedback circuit having said control current as an input and having as an output a charge pump current which determines the magnitude of said positive and negative current pulses generated by said charge pump, wherein said feedback circuit insures that said charge pump current has a minimum value B, and wherein said value B insures that said charge pump current has a non-zero value, and wherein said feedback circuit insures that said control current is above a threshold A to cause an increase in said charge pump current.

11. The phase-locked-loop of claim 10 wherein said charge pump current increases when said control current increases and said charge pump current decreases when said control current decreases.

12. The phase-locked-loop of claim 10 wherein said charge pump has a gain which that is dependent on the control current in a manner which linearizes the combination of the charge pump and current controlled oscillator.

* * * * *